(12) United States Patent
Park

(10) Patent No.: US 11,356,824 B2
(45) Date of Patent: Jun. 7, 2022

(54) WIRELESS CONTROL SYSTEM, WIRELESS CONTROL METHOD, AND BATTERY PACK

(71) Applicant: LG CHEM, LTD., Seoul (KR)

(72) Inventor: Chan-Ha Park, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 92 days.

(21) Appl. No.: 17/043,999

(22) PCT Filed: Nov. 4, 2019

(86) PCT No.: PCT/KR2019/014838
§ 371 (c)(1),
(2) Date: Sep. 30, 2020

(87) PCT Pub. No.: WO2020/105903
PCT Pub. Date: May 28, 2020

(65) Prior Publication Data
US 2021/0037407 A1    Feb. 4, 2021

(30) Foreign Application Priority Data
Nov. 21, 2018    (KR) .......................... 10-2018-0144857

(51) Int. Cl.
*G01R 31/00* (2006.01)
*G01R 31/371* (2019.01)
(Continued)

(52) U.S. Cl.
CPC ............ *H04W 4/48* (2018.02); *G01R 31/005* (2013.01); *G01R 31/371* (2019.01);
(Continued)

(58) Field of Classification Search
CPC . G01R 31/005–008; G01R 31/36–396; H01M 10/42–526; H01M 50/50–598;
(Continued)

(56) References Cited

U.S. PATENT DOCUMENTS 6,901,275 B1    5/2005    Aoyagi
2002/0075941 A1    6/2002    Souissi et al.
(Continued)

FOREIGN PATENT DOCUMENTS

CN    204086490 U    1/2015
CN    108306067 A    7/2018
(Continued)

OTHER PUBLICATIONS

Office Action dated Aug. 4, 2021, issued in corresponding Chinese Patent Application No. 201980015993.0.
(Continued)

*Primary Examiner* — Timothy J Weidner
(74) *Attorney, Agent, or Firm* — Morgan, Lewis & Bockius LLP

(57) ABSTRACT

The present disclosure includes a wireless control system, a wireless control method, and a battery pack. The wireless control system includes a master configured to wirelessly transmit a first command packet, and first to $N^{th}$ slaves to which first to $N^{th}$ IDs are allocated, respectively. When the first slave receives the first command packet, the first slave wirelessly transmits a first response packet including first battery information and the first ID. When a $k+1^{th}$ slave receives the first command packet, the $k+1^{th}$ slave stands by to receive a $k^{th}$ response packet for a preparation period and wirelessly transmits a $k+1^{th}$ response packet including $k+1^{th}$ battery information and a $k+1^{th}$ ID. When the $k^{th}$ response packet is received by the $k+1^{th}$ slave within the preparation period, the $k+1^{th}$ response packet further includes $k^{th}$ battery information and a $k^{th}$ ID.

13 Claims, 8 Drawing Sheets

(51) Int. Cl.

| | | |
|---|---|---|
| *G01R 31/382* | (2019.01) | |
| *H01M 10/42* | (2006.01) | |
| *H04L 12/40* | (2006.01) | |
| *H04L 12/403* | (2006.01) | |
| *H04L 67/12* | (2022.01) | |
| *H04L 69/00* | (2022.01) | |
| *H04W 4/38* | (2018.01) | |
| *H04W 4/48* | (2018.01) | |
| *H04W 24/02* | (2009.01) | |
| *H04W 24/10* | (2009.01) | |
| *H04W 52/02* | (2009.01) | |
| *H04W 52/34* | (2009.01) | |
| *H04W 52/46* | (2009.01) | |
| *H04W 84/18* | (2009.01) | |
| *H04W 88/04* | (2009.01) | |

(52) U.S. Cl.
CPC ...... *G01R 31/382* (2019.01); *H01M 10/4207* (2013.01); *H01M 10/4285* (2013.01); *H04L 12/403* (2013.01); *H04L 12/40019* (2013.01); *H04L 67/12* (2013.01); *H04L 69/26* (2013.01); *H04W 4/38* (2018.02); *H04W 24/02* (2013.01); *H04W 24/10* (2013.01); *H04W 52/0212* (2013.01); *H04W 52/34* (2013.01); *H04W 52/46* (2013.01); *H04L 2012/40215* (2013.01); *H04L 2012/40273* (2013.01); *H04W 84/18* (2013.01); *H04W 88/04* (2013.01); *Y02D 30/70* (2020.08); *Y02E 60/10* (2013.01)

(58) Field of Classification Search
CPC . H04L 12/40–417; H04L 2012/40208–40293; H04L 67/12–125; H04L 69/26–28; H04W 4/30–80; H04W 24/02–10; H04W 28/0215–0221; H04W 52/02–60; H04W 84/18–22; H04W 88/02; H04W 88/04; H04W 88/08; H04W 92/02; H04W 92/04; H04W 92/10; H04W 92/12; H04W 92/16; H04W 92/18; H04W 92/20; Y02D 30/70; Y02E 60/10
See application file for complete search history.

(56) References Cited

U.S. PATENT DOCUMENTS

| | | |
|---|---|---|
| 2011/0175574 A1 | 7/2011 | Sim et al. |
| 2012/0268069 A1 | 10/2012 | Park et al. |
| 2014/0035365 A1 | 2/2014 | Yoo |
| 2014/0347013 A1 | 11/2014 | Kim |
| 2014/0365792 A1 | 12/2014 | Yun |
| 2015/0028816 A1 | 1/2015 | Lee |
| 2016/0056510 A1* | 2/2016 | Takeuchi ............. G01R 31/371 |
| 2017/0346308 A1* | 11/2017 | Kain ..................... H04L 12/42 |
| 2018/0012484 A1 | 1/2018 | Sakabe et al. |
| 2019/0242949 A1 | 8/2019 | Lemkin et al. |
| 2021/0025944 A1* | 1/2021 | Park ....................... H04W 4/38 |

FOREIGN PATENT DOCUMENTS

| | | | | |
|---|---|---|---|---|
| JP | 2012-222913 A | | 11/2012 | |
| JP | 2012222913 A | * | 11/2012 | ............. Y02E 60/10 |
| JP | 2014-183728 A | | 9/2014 | |
| JP | 6421625 B2 | | 11/2018 | |
| KR | 10-1245279 B1 | | 3/2013 | |
| KR | 10-2014-0060801 A | | 5/2014 | |
| KR | 10-2014-0138067 A | | 12/2014 | |
| KR | 10-2014-0143076 A | | 12/2014 | |
| KR | 10-1540086 B1 | | 7/2015 | |
| KR | 10-1631064 B1 | | 6/2016 | |
| KR | 10-2017-0051071 A | | 5/2017 | |
| KR | 10-2017-0056061 A | | 5/2017 | |
| KR | 10-2017-0116377 A | | 10/2017 | |
| KR | 10-2018-013210 A | | 9/2018 | |
| WO | 2014/103008 A1 | | 1/2017 | |
| WO | 2018/005631 A | | 1/2018 | |
| WO | 2018/061459 A1 | | 4/2018 | |

OTHER PUBLICATIONS

Office Action dated Jul. 13, 2021, issued in corresponding Japanese Patent Application No. 2020-541385.
Extended European Search Report dated Apr. 20, 2021, issued in corresponding European Patent Application No. 19888028.8.
Dagar, Mousam et al., "Data Aggregation in Wireless Sensor Network: A Survey," International Journal of Information and Computation Technology, vol. 3, No. 3, Jan. 1, 2013, pp. 167-174, XP055794069, Received from the Internet: URL: https://www.ripublication.com/irph/ijict_spl/11_ijictv3n3spl.pdf [retrieved on Apr. 9, 2021] * section 3.2.2; pp. 169-170.
International Search Report issued in corresponding International Patent Application No. PCT/KR2019/014838, dated Feb. 21, 2020.

* cited by examiner

WIRELESS CONTROL SYSTEM, WIRELESS CONTROL METHOD, AND BATTERY PACK

TECHNICAL FIELD

The present disclosure relates to a wireless control system and a wireless control method for wirelessly collecting battery information and a battery pack including the wireless control system.

The present application claims priority to Korean Patent Application No. 10-2018-0144857 filed in the Republic of Korea on Nov. 21, 2018, the disclosure of which is incorporated herein by reference.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

A battery pack for a device requiring high capacity and high voltage such as an electric vehicle generally includes a plurality of battery modules connected in series. To manage the condition of the plurality of battery modules individually and efficiently, a control system having multi-slave is disclosed. The control system having multi-slave includes a plurality of slaves for monitoring the condition of each battery module and a master that controls the entire operation of the plurality of slaves.

However, when wireless communication is carried out between the master and the plurality of slaves, wireless connection between the master and at least one slave may be unwantedly disconnected due to external noise.

DISCLOSURE

Technical Problem

The present disclosure is designed to solve the above-described problem, and therefore the present disclosure is directed to providing a wireless control system, a wireless control method and a battery pack, in which at least one slave wirelessly forwards, to the master, not only battery information of a battery module coupled to the slave, but also an additional battery information from other slave, so that the master may wirelessly collect battery information indicating the condition of each of a plurality of battery modules with high reliability.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A wireless control system according to an aspect of the present disclosure is for wirelessly collecting battery information of each of first to $N^{th}$ battery modules. The wireless control system includes a master configured to wirelessly transmit a first command packet, and first to $N^{th}$ slaves to which first to $N^{th}$ IDs are allocated, respectively. The first slave is configured to wirelessly transmit a first response packet including first battery information indicating a condition of the first battery module and the first ID, when the first slave receives the first command packet. A $k+1^{th}$ slave is configured to, when the $k+1^{th}$ slave receives the first command packet, stand by to receive a $k^{th}$ response packet from a $k^{th}$ slave for a preparation period, and wirelessly transmit a $k+1^{th}$ response packet including $k+1^{th}$ battery information indicating a condition of the $k+1^{th}$ battery module and a $k+1^{th}$ ID. When the $k^{th}$ response packet is received by the $k+1^{th}$ slave within the preparation period, the $k+1^{th}$ response packet further includes $k^{th}$ battery information indicating a condition of a $k^{th}$ battery module and a $k^{th}$ ID. N is a natural number of 2 or greater, and k is a natural number of 1 or greater and N−1 or smaller.

The $N^{th}$ slave may be configured to wirelessly transmit an $N^{th}$ response packet including $N^{th}$ battery information indicating a condition of the $N^{th}$ battery module and the $N^{th}$ ID at least two times, when the $N^{th}$ slave receives the first command packet.

The $N^{th}$ slave may be configured to wirelessly transmit an $N^{th}$ response packet including $N^{th}$ battery information indicating a condition of the $N^{th}$ battery module and the $N^{th}$ ID, when the $N^{th}$ slave receives the first command packet. An $N-1^{th}$ slave may be configured to wirelessly transmit an additional response packet including the $N^{th}$ battery information and the $N^{th}$ ID, when the $N-1^{th}$ slave receives the $N^{th}$ response packet.

The $k+1^{th}$ response packet does not include the $k^{th}$ ID and the $k^{th}$ battery information, when the $k^{th}$ response packet is not received by the $k+1^{th}$ slave within the preparation period.

The master may be configured to set the $k+1^{th}$ slave as a first group, when the $k+1^{th}$ response packet is received by the master within a predetermined period of time from a time point at which the first command packet was wirelessly transmitted. The master may be configured to set the $k+1^{th}$ slave as a second group, when the $k+1^{th}$ response packet is not received by the master within the predetermined period of time from the time point at which the first command packet was wirelessly transmitted.

The master may be configured to wirelessly transmit a second command packet, when at least one of the first to $N^{th}$ slaves is set as the second group. The second command packet includes the IDs of each slave set as the second group.

The master may be configured to wirelessly transmit the first command packet with a first signal strength. The master may be configured to wirelessly transmit the second command packet with a first amplified signal strength. The first amplified signal strength is higher than the first signal strength.

The $k+1^{th}$ slave may be configured to wirelessly transmit the $k+1^{th}$ response packet, when the second command packet includes the $k+1^{th}$ ID.

The $k+1^{th}$ slave may be configured to determine a relative rank of the $k+1^{th}$ ID among all the IDs included in the second command packet, when the second command packet includes the $k+1^{th}$ ID. The $k+1^{th}$ slave may be configured to wirelessly transmit the $k+1^{th}$ response packet at a time slot associated with the relative rank.

A battery pack according to another aspect of the present disclosure includes the wireless control system.

A wireless control method according to still another aspect of the present disclosure is for wirelessly collecting, by a master, first to $N^{th}$ battery information indicating conditions of first to $N^{th}$ battery modules from first to $N^{th}$ slaves to which first to $N^{th}$ IDs are allocated, respectively. The wireless control method includes wirelessly transmitting, by the master, a first command packet to the first to $N^{th}$ slaves, wirelessly transmitting, by the first slave, a first response packet including the first battery information and the first ID when the first slave receives the first command packet, and standing by, by the $k+1^{th}$ slave, to receive a $k^{th}$ response packet from the $k^{th}$ slave for a preparation period, and wirelessly transmitting a $k+1^{th}$ response packet including the $k+1^{th}$ battery information and the $k+1^{th}$ ID, when the $k+1^{th}$ slave receives the first command packet. The $k+1^{th}$ response packet further includes the $k^{th}$ battery information indicating the condition of the $k^{th}$ battery module and the $k^{th}$ ID when the $k^{th}$ response packet is received by the $k+1^{th}$ slave within the preparation period. N is a natural number of 2 or greater, and k is a natural number of 1 or greater and N−1 or smaller.

The wireless control method may further include wirelessly transmitting, by the $N^{th}$ slave, an $N^{th}$ response packet including the $N^{th}$ battery information and the $N^{th}$ ID at least two times, when the $N^{th}$ slave receives the first command packet.

The wireless control method may further include wirelessly transmitting, by the $N^{th}$ slave, an $N^{th}$ response packet including the $N^{th}$ battery information and the $N^{th}$ ID, when the $N^{th}$ slave receives the first command packet, and wirelessly transmitting, by the $N-1^{th}$ slave, an additional response packet including the $N^{th}$ battery information and the $N^{th}$ ID, when the $N-1^{th}$ slave receives the $N^{th}$ response packet.

Advantageous Effects

According to at least one of the embodiments of the present disclosure, at least one slave may wirelessly forward not only battery information of a battery module coupled to the slave, but also an additional battery information from other slave, to the master.

In addition, according to at least one of the embodiments of the present disclosure, the master may only select each slave having failed wireless connection with the master among all the slaves and retry wireless connection with the selected slave.

Furthermore, according to at least one of the embodiments of the present disclosure, when wireless connection between the master and a specific slave fails, the master may wirelessly transmit a signal having higher signal strength than normal condition (i.e., when wireless connection is established) to the specific slave.

As a result, the master may wirelessly collect battery information indicating the condition of each of the plurality of battery modules with high reliability.

The effects of the present disclosure are not limited to the effects mentioned above, and these and other effects will be clearly understood by those skilled in the art from the appended claims.

BRIEF DESCRIPTION OF DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

BEST MODE

Figure 1:
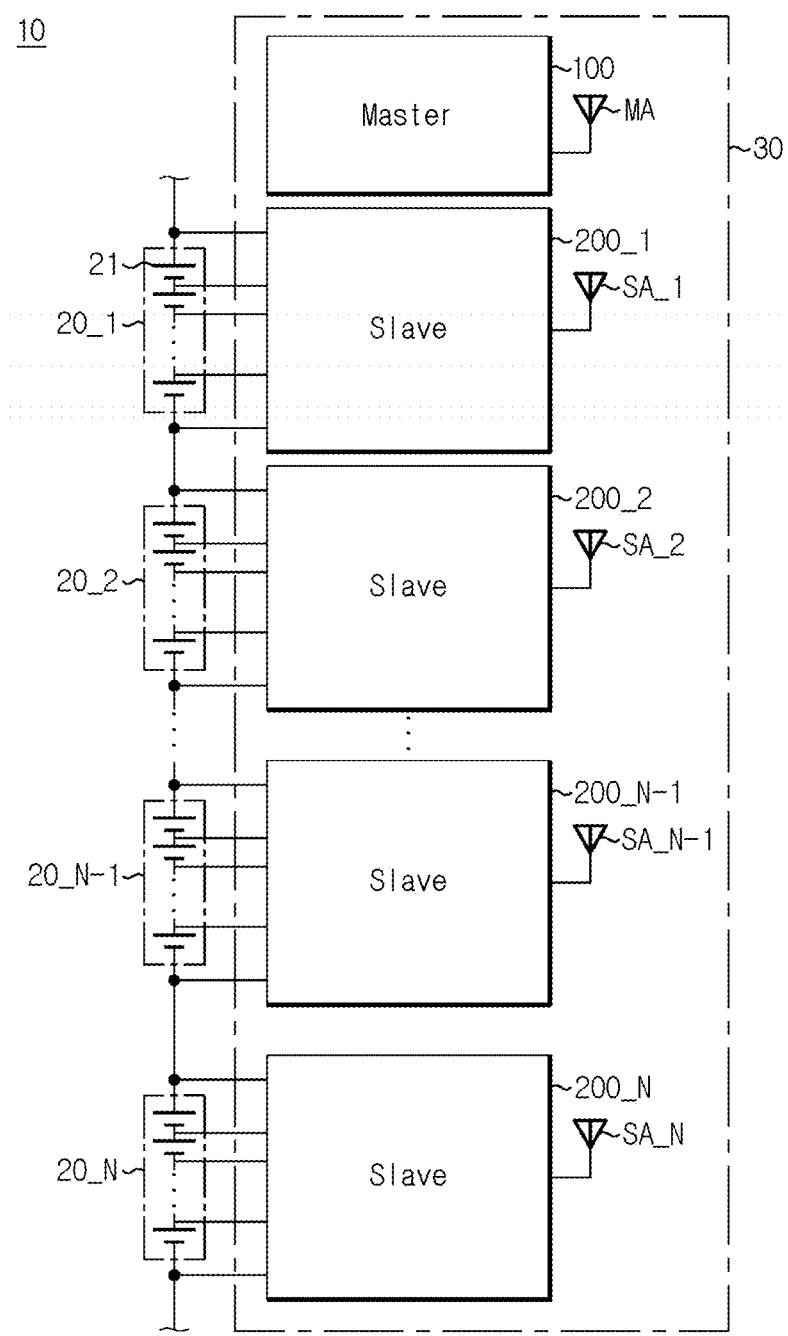
FIG. 1 is an exemplary diagram showing the configuration of a battery pack including a wireless control system.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term <control unit> as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

FIG. 1 is an exemplary diagram showing the configuration of a battery pack 10 including a wireless control system 30 according to an embodiment of the present disclosure.

Referring to FIG. 1, the battery pack 10 includes N battery modules 20 and the wireless control system 30. N is a natural number of 2 or greater. In the drawing, to identify the N battery modules 20, the reference signs 20_1~20_N are given to the N battery modules 20 in a sequential order. The battery pack 10 may be mounted in an electric vehicle to supply power required to drive an electric motor of the electric vehicle.

The N battery modules 20_1~20_N are electrically connected in series and/or in parallel. Each battery module 20 includes at least one battery cell 21.

The wireless control system 30 includes a master 100 and N slaves 200. In the drawing, to identify the N slaves 200, the reference signs 200_1~200_N are given to the N slaves 200 in a sequential order.

The master 100 is configured to control the entire battery pack 10. Each of the plurality of slaves 200_1~200_N is configured to perform wireless communication with the master 100 using an ID of each slave 200_1~200_N allocated from the master 100. The master 100 stores the IDs allocated to the plurality of slaves 200_1~200_N. The IDs are identification information for identifying the plurality of slaves 200_1~200_N.

The master 100 may communicate with an external main controller (e.g., an electronic control unit (ECU) of the electric vehicle) via a wired network such as Controller Area Network (CAN). The master 100 includes a master antenna MA, and may wirelessly communicate with each slave 200 through the master antenna MA.

The plurality of slaves 200_1~200_N is provided to the plurality of battery modules 20_1~20_N one-to-one. When i=1~N, the slave 200_$i$ is electrically connected to positive and negative terminals of each battery cell 21 of the battery module 20_$i$, and is configured to monitor the condition (e.g., voltage, current, temperature) of the battery module 20_$i$. The power required for the operation of the slave 200_$i$ may be supplied from the battery module 20_$i$.

Additionally, the slave 200_$i$ may wirelessly transmit data (hereinafter referred to as 'battery information') indicating the monitored condition of the battery module 20_$i$ to the master 100.

The master 100 may calculate a state of charge (SOC) and a state of health (SOH) of the battery module 20_$i$, or determine overvoltage, undervoltage, overcharge or overdischarge of each battery cell 21 of the battery module 20_$i$, based on the battery information from the slave 200_$i$.

The slaves 200_1~200_N is positioned at different areas inside the battery pack 10 such that communication distances to the master 100 are different to each other. The communication distance between the slave 200_$i$ and the master 100 may be a straight line distance between the antenna SA_$i$ of the slave 200_$i$ and the antenna MA of the master 100. Hereinafter, it is assumed that the communication distance between the slave 200_$i$ and the master 100 is shorter than the communication distance between the slave 200_$i$+1 and the master 100. For example, referring to FIG. 1, the antenna SA_$i$ of the slave 200_$i$ is positioned closer to the antenna MA of the master 100 than the antenna SA_$i$+1 of the slave 200_$i$+1. The antenna SA_$i$ of the slave 200_$i$ may be said to be positioned on the 'upstream side' of the antenna SA_$i$+1 of the slave 200_$i$+1, and the antenna SA_$i$+1 of the slave 200_$i$+1 may be said to be positioned on the 'downstream side' of the antenna SA_$i$ of the slave 200_$i$.

Hereinafter, it is assumed that an ID of higher rank is allocated to a slave having a shorter communication distance with the master 100. For example, the rank of the ID of the slave 200_$i$ is higher than the rank of the ID of the slave 200_$i$+1.

The master 100 is configured to classify each of the plurality of slaves 200_1~200_N into any one of a first group and a second group in each predetermined cycle. The master 100 may scan a response packet from the second group for a standby period from the time point at which the master 100 wirelessly transmitted a command packet.

When the command packet includes the ID of the slave 200, the corresponding slave 200 may be configured to wirelessly transmit a response packet to the master 100 in response to the command packet.

When the master 100 receives a response packet from a specific slave (e.g., 200_2) belonging to the second group within a predetermined period of time from the time point at which the command packet was transmitted, the master 100 classifies the corresponding specific slave from the second group to the first group. On the contrary, when the master 100 does not receive a response packet from the specific slave belonging to the second group for the predetermined period of time from the time point at which the command packet was transmitted, the master 100 maintains the corresponding specific slave as the second group.

Figure 2:
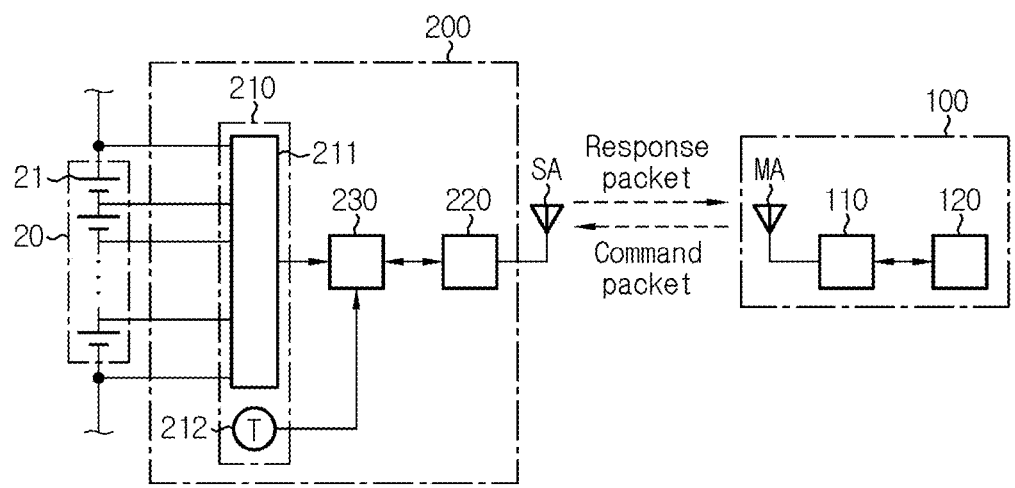
FIG. 2 is an exemplary diagram showing the detailed configuration of a master and a slave of FIG. 1.

FIG. 2 is an exemplary diagram showing the detailed configuration of the master 100 and the slave 200 of FIG. 1.

Referring to FIG. 2, the master 100 includes an antenna MA, a wireless communication circuit 110 and a control unit 120. The power required for the operation of the master 100 may be supplied from at least one of the plurality of battery modules 20_1~20_N or an external power source (not shown) such as a lead-acid battery.

The wireless communication circuit 110 is configured to wirelessly transmit a command packet to the slave 200 through the antenna MA. Additionally, the wireless communication circuit 110 is configured to receive a response packet from the slave 200 through the antenna MA.

The control unit 120 is operably connected to the wireless communication circuit 110. The control unit 120 may determine request information (e.g., cell voltage balancing) to at least one of the plurality of slaves 200_1~200_N based on a signal (e.g., a signal indicating battery information) received through the antenna MA, and wirelessly transmit a command packet including data indicating the request information to at least one of the plurality of slaves 200_1~200_N.

The control unit 120 may be implemented, by hardware, using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions. The control unit 120 may have a memory device embedded therein, and the memory device may include, for example, RAM, ROM, register, hard disk, optical recording media or magnetic recording media. The memory device may store, update and/or erase programs including various types of control logics that are executed by the control unit 120, and/or data created when the control logics are executed.

The slave 200 includes an antenna SA, a sensing unit 210, a wireless communication circuit 220 and a control unit 230.

The sensing unit 210 includes a voltage measurement circuit 211 and a temperature sensor 212. The sensing unit 210 may further include a current sensor (not shown). The voltage measurement circuit 211 includes at least one voltage sensor.

The voltage measurement circuit 211 measures a module voltage of the battery module 20. The module voltage is a voltage across the battery module 20. Additionally, the voltage measurement circuit 211 may further measure a cell voltage of each battery cell 21 included in the battery module 20. The cell voltage is a voltage across the battery cell 21. The voltage measurement circuit 211 transmits a voltage signal indicating the module voltage and the voltage of the cell 21 to the control unit 230.

The temperature sensor 212 is positioned within a predetermined distance from the battery module 20, and transmits a temperature signal indicating the temperature of the battery module 20 to the control unit 230.

The current sensor is installed on a current path provided for charging/discharging of the battery pack 10 to measure the current flowing during charging/discharging of the battery pack 10 and transmit a current signal indicating the magnitude and direction of the measured current to the control unit 230.

The wireless communication circuit 220 is connected to the control unit 230 and the antenna SA. The wireless communication circuit 220 may be implemented, by hardware, using Radio Frequency System on Chip (RF SoC). The wireless communication circuit 220 may wirelessly transmit data to the master 100 or the slave 200 or wirelessly receive data from the master 100 or the slave 200 through the antenna SA.

The control unit 230 may be operably coupled to the sensing unit 210 and the wireless communication circuit 220 to individually control the operation of each of the sensing unit 210 and the wireless communication circuit 220. The control unit 230 may be implemented, by hardware, using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions. The control unit 230 may have a memory device embedded therein, and the memory device may include, for example, RAM, ROM, register, hard disk, optical recording media or magnetic recording media. The memory device may store, update and/or erase programs including various types of control logics that are executed by the control unit 230, and/or data created when the control logics are executed.

The wireless communication circuit 220 is configured to selectively perform at least one of predefined functions in response to the signal from the master 100 or the slave 200 wirelessly received through the antenna SA.

When a signal is received through the antenna SA, the wireless communication circuit 220 may measure the signal strength of the received signal. When the wireless communication circuit 220 receives the command packet from the master 100 through the antenna SA, the wireless communication circuit 220 may wirelessly transmit a response packet to the master 100 in response to the command packet. The response packet is a signal for reporting to the master 100 that the slave 200 succeeded in receiving the command packet.

Figure 3:
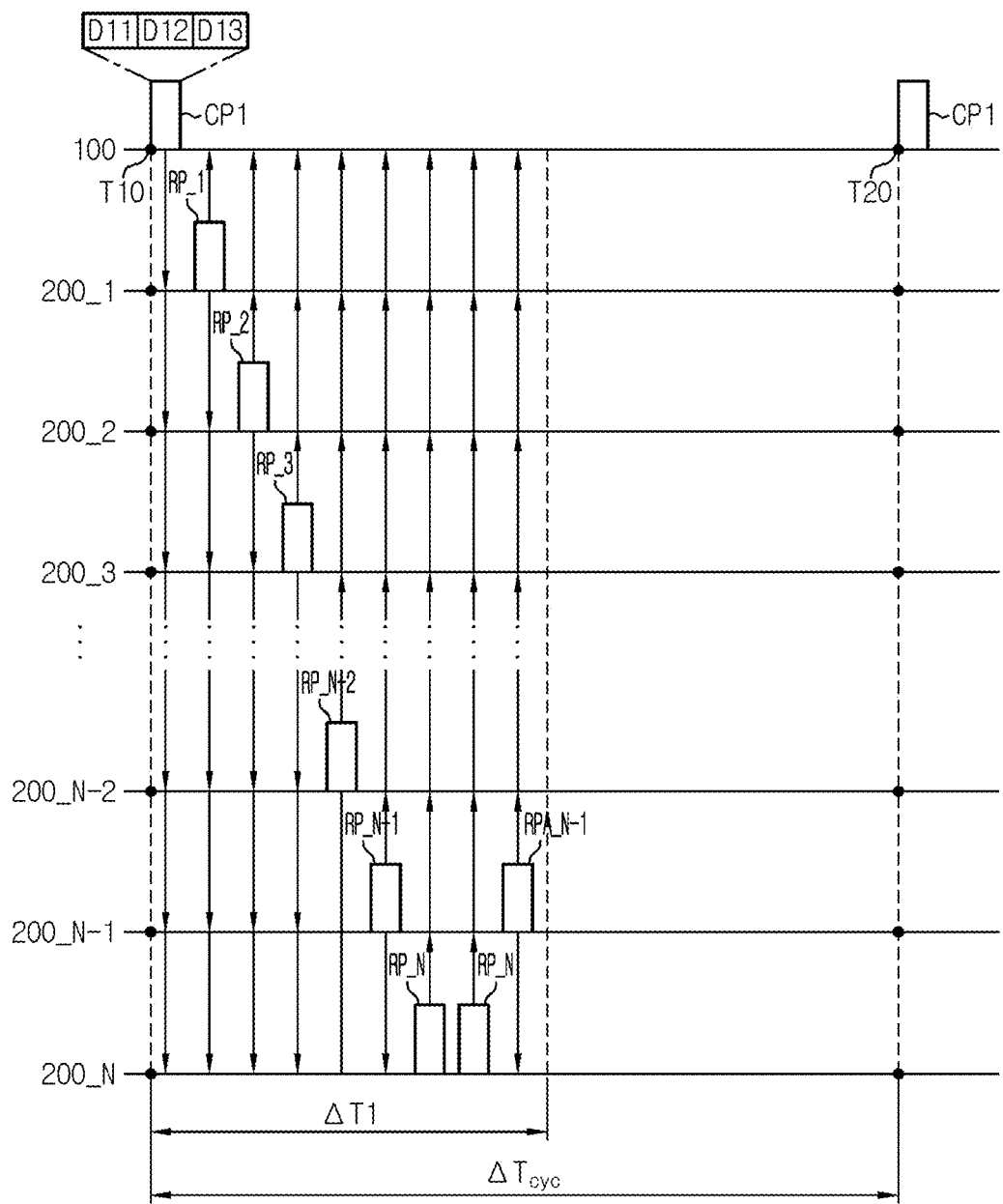
FIG. 3 is an exemplary timing chart illustrating a process in which a master of FIG. 1 wirelessly collects response packets from a plurality of slaves.

FIG. 3 is an exemplary timing chart illustrating a process in which the master 100 of FIG. 1 wirelessly collects response packets from the plurality of slaves 200_1~200_N. To identify the response packets from the N slaves 200_1~200_N, the reference signs RP_1~RP_N are given to the N response packets in a sequential order.

In FIG. 3, to identify the response packets from the N slaves 200_1~200_N, the reference signs RP_1~RP_N are given to the N response packets in a sequential order. In FIG. 3, the time point T10 may indicate a start time of an arbitrary cycle, and the time point T20 may indicate a start time of the next cycle. Additionally, it is assumed that a time interval $\Delta T_{cyc}$ of each cycle is divided into N or more time slots, and N time slots are allocated to the plurality of slaves 200_1~200_N in a sequential order.

At the time point T10, the master 100 wirelessly transmits a command packet CP1 to the plurality of slaves 200_1~200_N. The master 100 may wirelessly transmit the command packet CP1 with a predetermined first signal strength. The command packet CP1 may be transmitted from the master 100 to the plurality of slaves 200_1~200_N all at once through a broadcasting method. The command packet CP1 includes first data D11 and second data D12, and may further include third data D13. The first data D11 indicates whether the corresponding command packet CP1 was transmitted by the master 100 for the first time in the current cycle. For example, the first data D11 being a first value (e.g., 0) indicates that the corresponding command packet CP1 is transmitted for the first time in the current cycle. The second data D12 includes request information to the plurality of slaves 200_1~200_N. The request information is for requesting a slave belonging to the second group to perform a specific function (e.g., voltage measurement, cell voltage balancing). The third data D13 may include the IDs of all of the plurality of slaves 200_1~200_N.

Each of the plurality of slaves 200_1~200_N wirelessly transmits a response packet RP at the time slot allocated to each slave 200_1~200_N when wirelessly receiving the command packet CP1.

When i=1~N, the slave 200_i wirelessly transmits the response packet RP at the $i^{th}$ time slot among the N or more time slots. The response packet RP_i includes the $i^{th}$ ID allocated to the slave 200_i and the $i^{th}$ battery information indicating the condition of the battery module 20_i. The response packet RP_i may be wirelessly transmitted by a broadcasting method with a predetermined second signal strength or a reference signal strength allocated to the slave 200_i. Accordingly, the response packet RP_i may be received by not only the master 100 but also slaves (e.g., 200_i−1, 200_i+1) other than the slave 200_i.

When k=1~N−1, the k+1$^{th}$ slave 200_k+1 is configured to stand by to receive the response packet (e.g., RP_k) from at least one slave (e.g., 200_k) having an ID of higher rank than the ID of the k+1$^{th}$ slave 200_k+1 for a k+1$^{th}$ preparation period, and wirelessly transmit the k+1$^{th}$ response packet RP_k+1. The k+1$^{th}$ preparation period may be i) a period of time from the time point at which the command packet CP1 was received by the k+1$^{th}$ slave 200_k+1 to the time point at which a predetermined period of time has passed from the reception of the command packet CP1, or ii) a period of time from the time point at which the command packet CP1 was received by the k+1$^{th}$ slave 200_k+1 to the time point at which the time slot allocated to the k+1$^{th}$ slave 200_k+1 is reached.

When the k+1$^{th}$ slave 200_k+1 succeeds in receiving the k$^{th}$ response packet RP_k within the k+1$^{th}$ preparation period, the k+1$^{th}$ response packet RP_k+1 includes the k+1$^{th}$ ID and the k+1$^{th}$ battery information, and even the k$^{th}$ ID and the k$^{th}$ battery information included in the k$^{th}$ response packet RP_k. When the k+1$^{th}$ slave 200_k+1 succeeds in receiving an additional response packet (e.g., RP_k−1) other than the $k^{th}$ response packet RP_k, the $k+1^{th}$ response packet RP_k+1 may further include the $k-1^{th}$ ID and the $k-1^{th}$ battery information.

On the contrary, when the $k+1^{th}$ slave 200_$k$+1 fails to receive the $k^{th}$ response packet RP_k within the $k+1^{th}$ preparation period, the $k+1^{th}$ response packet RP_k+1 includes the $k+1^{th}$ ID and the $k+1^{th}$ battery information, but does not include the $k^{th}$ ID and the $k^{th}$ battery information.

When the $N^{th}$ slave 200_N receives the command packet CP1, the $N^{th}$ slave 200_N may wirelessly transmit the $N^{th}$ response packet RP_N at least two times. For example, the $N^{th}$ slave 200_N may wirelessly transmit the $N^{th}$ response packet RP_N for the first time in response to the command packet CP1, and after that, wirelessly transmit the $N^{th}$ response packet RP_N again one or more times in a predetermined time.

Alternatively, when the $N-1^{th}$ slave 200_N-1 receives the $N^{th}$ response packet RP_N after wirelessly transmitting the $N-1^{th}$ response packet RP_N-1, the $N-1^{th}$ slave 200_N-1 may wirelessly transmit an additional response packet RPA_N-1. The additional response packet RPA_N-1 includes the $N-1^{th}$ ID and the $N-1^{th}$ battery information, and further includes the $N^{th}$ ID and the $N^{th}$ battery information. The additional response packet RPA_N-1 may be wirelessly transmitted with the predetermined second signal strength or the reference signal strength allocated to the slave 200_N-1.

The master 100 scans the response packets RP_1~RP_N from the plurality of slaves 200_1~200_N for a predetermined period of time ΔT1 from the time point T10. When the master 100 succeeds in receiving the response packets RP_1~RP_N from the first to $N^{th}$ slaves 200_1~200_N within the predetermined period of time ΔT1 from the time point T10, the master 100 may terminate the process of wirelessly collecting the first to $N^{th}$ battery information from the plurality of slaves 200_1~200_N. Accordingly, within the period of time from the time point T10 until the time point T20 is reached, each of the first to $N^{th}$ battery information is wirelessly transmitted to the master 100 two or more times, thereby reducing the likelihood that the master 100 fails to collect at least one of the first to $N^{th}$ battery information.

FIG. 3 shows a situation in which the master 100 received all the response packets RP_1~RP_N within the predetermined period of time ΔT1 from the time point T10. Below is the operation when the master 100 failed to receive at least one of the response packets RP_1~RP_N within the predetermined period of time ΔT1 from the time point T10 will be described with reference to FIG. 4.

Figure 4:
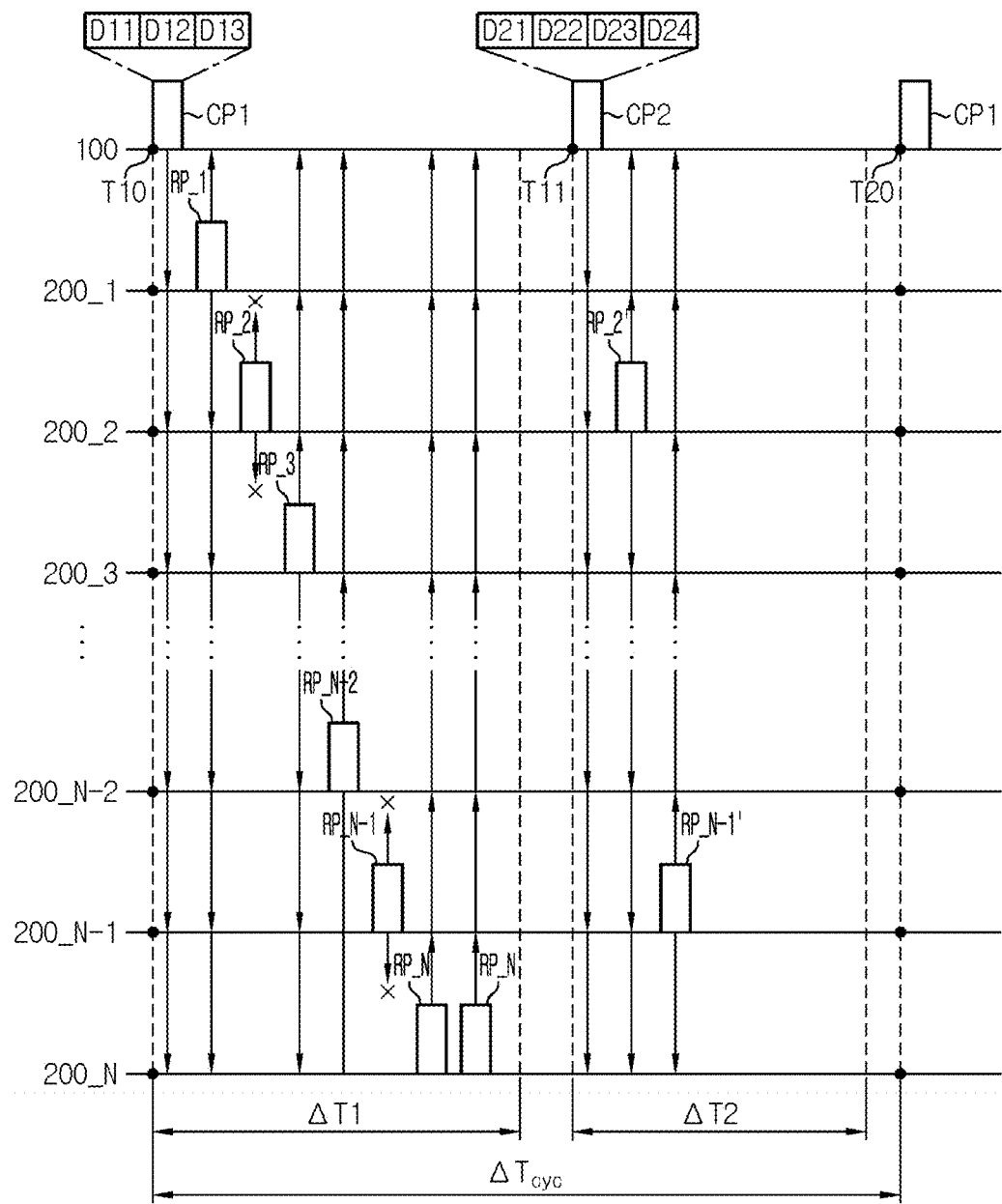
FIG. 4 is another exemplary timing chart illustrating a process in which a master of FIG. 1 wirelessly collects response packets from a plurality of slaves.

FIG. 4 is another exemplary timing chart illustrating the process in which the master 100 of FIG. 1 wirelessly collects response packets from the plurality of slaves 200_1~200_N.

Referring to FIG. 4, in the same way as FIG. 3, the master 100 wirelessly transmits a command packet CP1 at the time point T10, and scans response packets RP_1~RP_N from the plurality of slaves 200_1~200_N for the predetermined period of time ΔT1.

As opposed to the situation of FIG. 3, the master 100 receives the response packets RP_1, RP_3~RP_N-2, RP_N from the slaves 200_1, 200_3~200_N-2, 200_N within the predetermined period of time ΔT1 from the time point T10, but fails to receive the response packets RP_2, RP_N-1 from some slaves 200_2, 200_N-1. Meanwhile, the response packets RP_2, RP_N-1 may be wirelessly transmitted by the broadcasting method, and the other slaves (e.g., 200_3, 200_N) would have received the response packets RP_2, RP_N-1, respectively.

Then, the master 100 may set each of the slaves 200_1, 200_3~200_N-2, 200_N to which the IDs included in the response packets RP_1, RP_3~RP_N-2, RP_N are allocated as the first group, and each of the remaining slaves 200_2, 200_N-1 as the second group. Additionally, the master 100 may determine a gain value from a lookup table (see the reference number '700' in FIG. 7) by using, as an index, the ID (i.e., lowest ranked ID) of the slave 200_N-1 that ranks the lowest among the IDs of the slaves 200_2, 200_N-1 set as the second group (see the step S645 in FIG. 6 and the step S845 in FIG. 8).

At the time point T11, only the two slaves 200_2, 200_N-1 are set as the second group, while the remaining slaves 200_1, 200_3~200_N-2, 200_N are set as the first group. At the time point T11, the master 100 wirelessly transmits a command packet CP2. The master 100 may wirelessly transmit the command packet CP2 with the predetermined first signal strength or a first amplified signal strength. The first amplified signal strength may be higher than the first signal strength. The command packet CP2 includes first data D21, second data D22 and third data D23, and may further include fourth data D24. The first data D21 has a second value (e.g., 1), and the second value indicates that the command packet CP2 is for retrying wireless connection with the second group. The second data D22 includes request information to the slaves 200_2, 200_N-1 set as the second group. The third data D23 includes the IDs of all the slaves 200_2, 200_N-1 belonging to the second group. The command packet CP2 may be received by all the plurality of slave 200_1~200_N, while the command packet CP2 includes only the IDs of the two slaves 200_2, 200_N-1 belonging to the second group, and thus, the slaves 200_1, 200_3~200_N-2, 200_N set as the first group may delete the command packet CP2 from the memory devices thereof.

In contrast, when each of the slaves 200_2, 200_N-1 belonging to the second group receives the command packet CP2, each of the slaves 200_2, 200_N-1 belonging to the second group may determine a relative rank of the ID thereof to all the IDs included in the third data D23. When the slave 200_2 receives the command packet CP2, the slave 200_2 determines the rank of the ID of the slave 200_2 to be highest since there is no ID having a higher rank than the ID of the slave 200_2 among all the IDs included in the third data D23. When the slave 200_N-1 receives the command packet CP2, the slave 200_N-1 may determine the rank of the ID of the slave 200_N-1 to be second highest since there is one ID having a higher rank than the ID of the slave 200_N-1 among all the IDs included in the third data D23.

The slave 200_2 wirelessly transmits a response packet RP_2' at the timing (i.e., the first time slot) associated with the relative rank of the ID of the slave 200_2. Information included in the response packet RP_2' may be the same as the information included in the response packet RP_2.

The slave 200_N-1 may stand by to receive the response packet RP_2' from the slave 200_2 to which an ID of higher rank than the ID of the slave 200_N-1 is allocated, until the timing associated with the relative rank of the ID of the slave 200_N-1 is reached. When the slave 200_N-1 receives the response packet RP_2', the slave 200_N-1 transmits a response packet RP_N-1' to the master 100. The response packet RP_N-1' may include the $N-1^{th}$ ID and the $N-1^{th}$ battery information, and even the second ID and the second battery information included in the response packet RP_2'. Of course, the response packet RP_N-1' may further include the N−2th ID and the N−2th battery information included in the response packet RP_N−2 received before the time point T11.

The two slaves 200_2, 200_N−1 belonging to the second group may wirelessly transmit the response packets RP_2', RP_N−1' respectively with a predetermined second signal strength or a reference signal strength allocated to each of the slaves 200_2, 200_N−1. When i=1~N, the reference signal strength allocated to the slave 200_i may be higher than the reference signal strength allocated to the slave 200_i−1. That is, a higher reference signal strength may be allocated to a slave having a longer communication distance with the master 100.

The master 100 scans the response packets RP_2', RP_N−1' from the slaves 200_2, 200_N−1 belonging to the second group for a predetermined period of time ΔT2 from the time point T11. ΔT2 may be equal to or shorter or longer than ΔT1.

Assume that the master 100 received the response packets RP_2', RP_N−1' from all the slaves 200_2, 200_N−1 set as the second group within the predetermined period of time ΔT2 from the time point T11. Then, the master 100 may set the slaves 200_2, 200_N−1 from the second group to the first group, and terminate the process of wirelessly collecting the first to $N^{th}$ battery information from the plurality of slaves 200_1~200_N. Accordingly, each of the first to $N^{th}$ battery information is wirelessly transmitted to the master 100 two or more times, thereby reducing the likelihood that the master 100 fails to receive at least one of the first to $N^{th}$ battery information.

On the contrary, when at least one (e.g., RP_2) of the response packets RP_2', RP_N−1' was not received within the predetermined period of time ΔT2 from the time point T11, the master 100 may classify the slave (e.g., 200_N−1) into the first group, and maintain the slave (e.g., 200_2) as the second group. Subsequently, the master 100 may wirelessly transmit a new command packet to induce the slave (e.g., 200_2) remaining as the second group to wirelessly transmit the response packet RP_2' again.

Hereinafter, the 'first command packet' refers to a command packet having the first value as the first data, and the 'second command packet' refers to a command packet having the second value as the first data.

Figure 5:
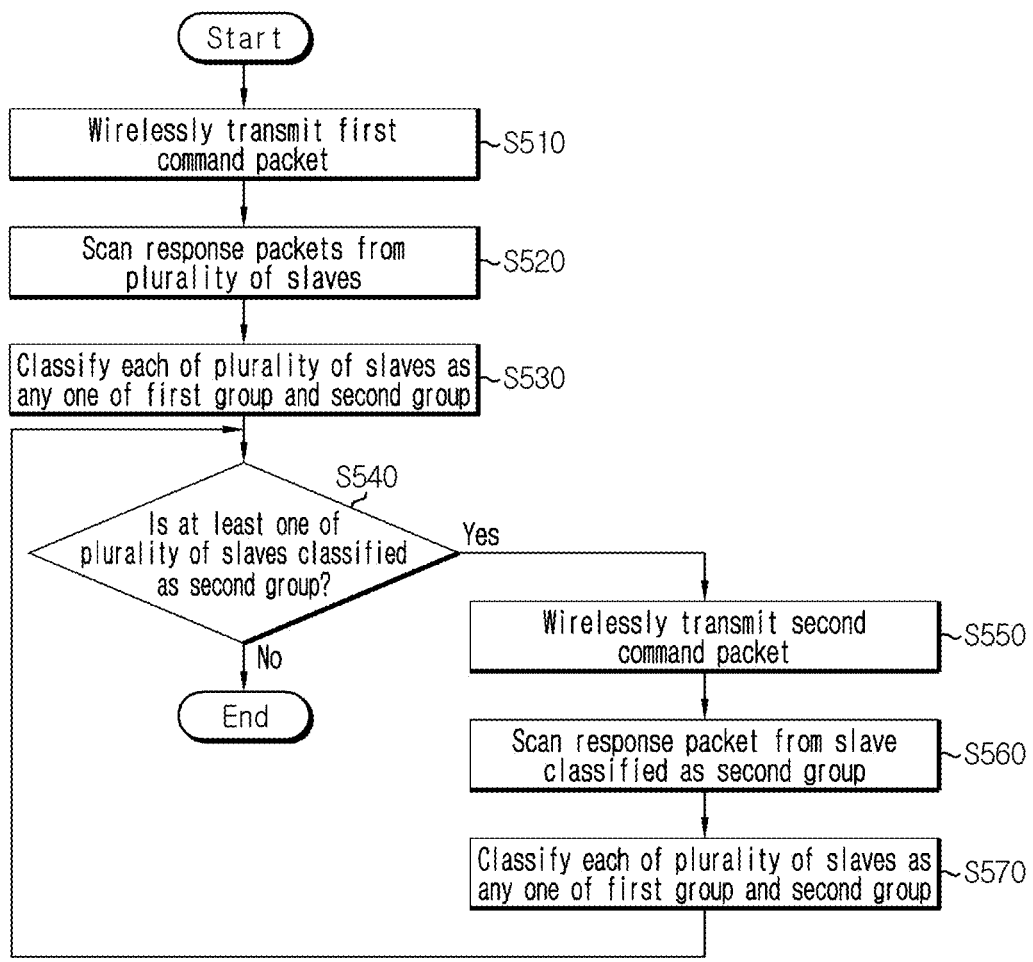
FIG. 5 is a flowchart showing a method for wirelessly collecting, by a master, response packets from a plurality of slaves according to a first embodiment of the present disclosure.

FIG. 5 is a flowchart showing a wireless control method for wirelessly collecting, by the master 100, response packets from the plurality of slaves 200_1~200_N according to the first embodiment of the present disclosure. The method of FIG. 5 may be performed in each predetermined cycle.

Referring to FIGS. 1 to 5, in step S510, the master 100 wirelessly transmits a first command packet. The first command packet may be wirelessly transmitted with the predetermined first signal strength. The first command packet includes first data and second data, and may further include third data. The first data of the first command packet has the first value indicating that the first command packet is for trying wireless connection with the plurality of slaves 200_1~200_N for the first time in the current cycle. The second data of the first command packet includes data for requesting the plurality of slaves 200_1~200_N to perform a specific function (e.g., voltage measurement, cell voltage balancing). The third data of the first command packet includes the IDs of the plurality of slaves 200_1~200_N.

When i=1~N, in case that the first data of the first command packet has the first value, the slave 200_i may perform the function requested by the second data of the first command packet, and wirelessly transmit a response packet RP_i including the ID of the slave 200_i.

In step S520, the master 100 scans the response packets RP_1~RP_N from the plurality of slaves 200_1~200_N for a first standby period. That is, the master 100 collects the response packets RP_1~RP_N wirelessly transmitted by the plurality of slaves 200_1~200_N until a predetermined period of time has passed from the time point at which the first command packet was transmitted.

In step S530, the master 100 classifies each of the plurality of slaves 200_1~200_N as any one of the first group and the second group. In detail, the master 100 may classify each slave 200 to which the ID of each response packet scanned for the first standby period is allocated as the first group, and classify the remaining slave 200 as the second group. That is, the slave 200 having not transmitted the response packet or having transmitted the response packet that was not received by the master 100 may be classified as the second group by the master 100.

In step S540, the master 100 determines whether at least one of the plurality of slaves 200_1~200_N is classified as the second group. That is, the master 100 checks if at least one slave 200 is still not wirelessly connected with the master 100 in the current cycle. When a value of the step S540 is "YES", step S550 is performed. The value of the step S540 being "NO" indicates successful wireless connection of the master 100 with all the plurality of slaves 200_1~200_N, and the wireless control method may end.

In step S550, the master 100 wirelessly transmits a second command packet. The second command packet may be wirelessly transmitted with the predetermined first signal strength. The second command packet includes first data, second data and third data. The first data of the second command packet has the second value indicating that the second command packet is for retrying wireless connection between the master 100 and the second group. The second data of the second command packet includes data for requesting all the slaves 200 belonging to the second group to perform a specific function. The third data of the second command packet includes the IDs of all the slaves 200 belonging to the second group.

When receiving the second command packet, each of the plurality of slaves 200_1~200_N determines whether the third data of the second command packet includes the ID thereof in response to the first data of the second command packet having the second value. The slave 200 belonging to the second group performs the function requested by the second data of the second command packet whose the third data includes the ID of the corresponding slave 200, and transmits a response packet including the ID of the corresponding slave 200 with the predetermined second signal strength or the reference signal strength allocated thereto to the master 100. In contrast, the slave 200 belonging to the first group does not transmit a response packet as the second data of the second command packet does not include the ID of the corresponding slave 200, and may delete the second command packet from the memory device of the corresponding slave 200 (i.e., ignore the request made by the third data of the second command packet).

In step S560, the master 100 scans the response packet from the slave 200 classified as the second group for a second standby period. That is, the master 100 collects the response packet wirelessly transmitted by each slave 200 belonging to the second group until a predetermined period of time has passed from the time point at which the second command packet was transmitted.

In step S570, the master 100 classifies each of the plurality of slaves 200_1~200_N as any one of the first group and the second group. In detail, the master 100 may classify the slave 200 to which the ID of each response packet scanned for the second standby period is allocated from the second group to the first group, and maintain the remaining slave 200 belonging to the second group as the second group. After the step S570, the wireless control method may advance to the step S540.

Figure 6:
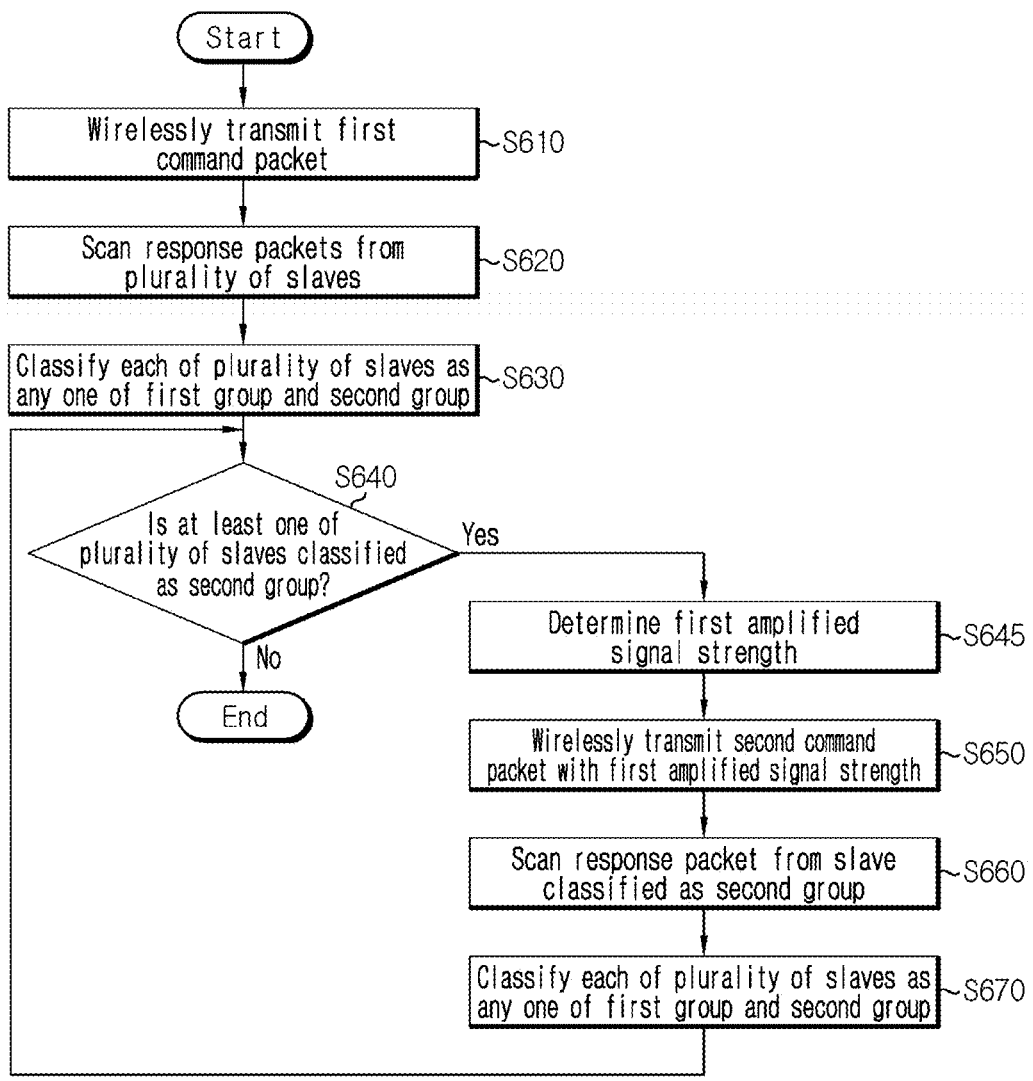
FIG. 6 is a flowchart showing a method for wirelessly collecting, by a master, response packets from a plurality of slaves according to a second embodiment of the present disclosure.
Figure 7:
FIG. 7 is an exemplary diagram of a lookup table associated with a second embodiment.

FIG. 6 is a flowchart showing a wireless control method for wirelessly collecting, by the master 100, response packets from the plurality of slaves 200_1~200_N according to a second embodiment of the present disclosure, and FIG. 7 is an exemplary diagram of a lookup table 700 associated with the second embodiment. The method of FIG. 6 may be performed in each predetermined cycle.

Referring to FIGS. 1 to 4, 6 and 7, in step S610, the master 100 wirelessly transmits a first command packet. The first command packet may be wirelessly transmitted with the predetermined first signal strength. The first command packet includes first data and second data, and may further include third data. The first data of the first command packet has the first value indicating that the first command packet is for trying wireless connection with the plurality of slaves 200_1~200_N for the first time in the current cycle. The second data of the first command packet includes data for requesting the plurality of slaves 200_1~200_N to perform a specific function. The third data of the first command packet includes the IDs of the plurality of slaves 200_1~200_N.

When the first data of the first command packet has the first value, each of the plurality of slaves 200_1~200_N may perform the function requested by the second data of the first command packet, and wirelessly transmit a response packet including the ID thereof with the predetermined second signal strength or the reference signal strength allocated thereto.

In step S620, the master 100 scans the response packets from the plurality of slaves 200_1~200_N for the first standby period. That is, the master 100 collects the response packets wirelessly transmitted by the plurality of slaves 200_1~200_N until a predetermined period of time has passed from the time point at which the first command packet was transmitted.

In step S630, the master 100 classifies each of the plurality of slaves 200_1~200_N as any one of the first group and the second group. In detail, the master 100 may classify the slave 200 to which the ID of each response packet scanned for the first standby period is allocated as the first group, and classify the remaining slave 200 as the second group. That is, the slave 200 having not transmitted the response packet or having transmitted the response packet that was not received by the master 100 may be classified as the second group by the master 100.

In step S640, the master 100 determines whether at least one of the plurality of slaves 200_1~200_N is classified as the second group. That is, the master 100 checks if at least one slave 200 is still not wirelessly connected with the master 100 in the current cycle. When a value of the step S640 is "YES", step S645 is performed. The value of the step S640 being "NO" indicates that the master 100 is wirelessly connected with all the plurality of slaves 200_1~200_N, and the wireless control method may end.

In step S645, the master 100 determines a first gain value from the lookup table 700 using the lowest ranked ID among the IDs of at least one slave 200 belonging to the second group as an index. In detail, the lookup table 700 stores a plurality of gain values $G_1$~$G_N$ associated with the IDs $S_1$~$S_N$ of the plurality of slaves 200_1~200_N, respectively. At least one of the plurality of gain values $G_1$~$G_N$ is greater than 1. For example, $G_1$>1. In the lookup table 700, a lower ranked ID is associated with a larger gain value. When i=1~N, for example, $S_i$ is the ID of the slave 200_i, and is associated with $G_i$, $G_{i-1}$<$G_i$. When the slave 200_2 and the slave 200_N-1 belong to the second group as shown in FIG. 3, $S_{N-1}$ is the lowest ranked ID, and thus $G_{N-1}$ is determined as the first gain value.

In step S650, the master 100 wirelessly transmits a second command packet with the first amplified signal strength. The first amplified signal strength equals to the first signal strength multiplied by the first gain value determined in the step S645. The second command packet includes first data, second data and third data. The first data of the second command packet has the second value indicating that the second command packet is for retrying wireless connection between the master 100 and the second group. The second data of the second command packet includes data for requesting all the slaves 200 belonging to the second group to perform a specific function. The third data of the second command packet includes the IDs of all the slaves 200 belonging to the second group.

When receiving the second command packet, each of the plurality of slaves 200_1~200_N determines whether the second data of the second command packet has the ID thereof in response to the first data of the second command packet having the second value. The slave 200 belonging to the second group performs the function requested by the second data of the second command packet whose the third data includes the ID of the corresponding slave 200, and transmits a response packet including the ID of the corresponding slave 200 with the predetermined second signal strength or the reference signal strength allocated to the corresponding slave 200 to the master 100. In contrast, the slave 200 belonging to the first group does not transmit the response packet as the second data of the second command packet does not include the ID of the corresponding slave 200, and may delete the second command packet from the memory device of the corresponding slave 200 (i.e., ignore the request made by the third data of the second command packet).

In step S660, the master 100 scans the response packet from the slave 200 classified as the second group for the second standby period. That is, the master 100 collects the response packet wirelessly transmitted by each slave 200 belonging to the second group from the time point at which the second command packet was transmitted from the time point at which a predetermined period of time has passed from the transmission of the second command packet.

In step S670, the master 100 classifies each of the plurality of slaves 200_1~200_N as any one of the first group and the second group. In detail, the master 100 may classify the slave 200 to which the ID of each response packet scanned for the second standby period is allocated from the second group to the first group, and maintain the remaining slave 200 belonging to the second group as the second group. After the step S670, the wireless control method may move to the step S640.

Figure 8:
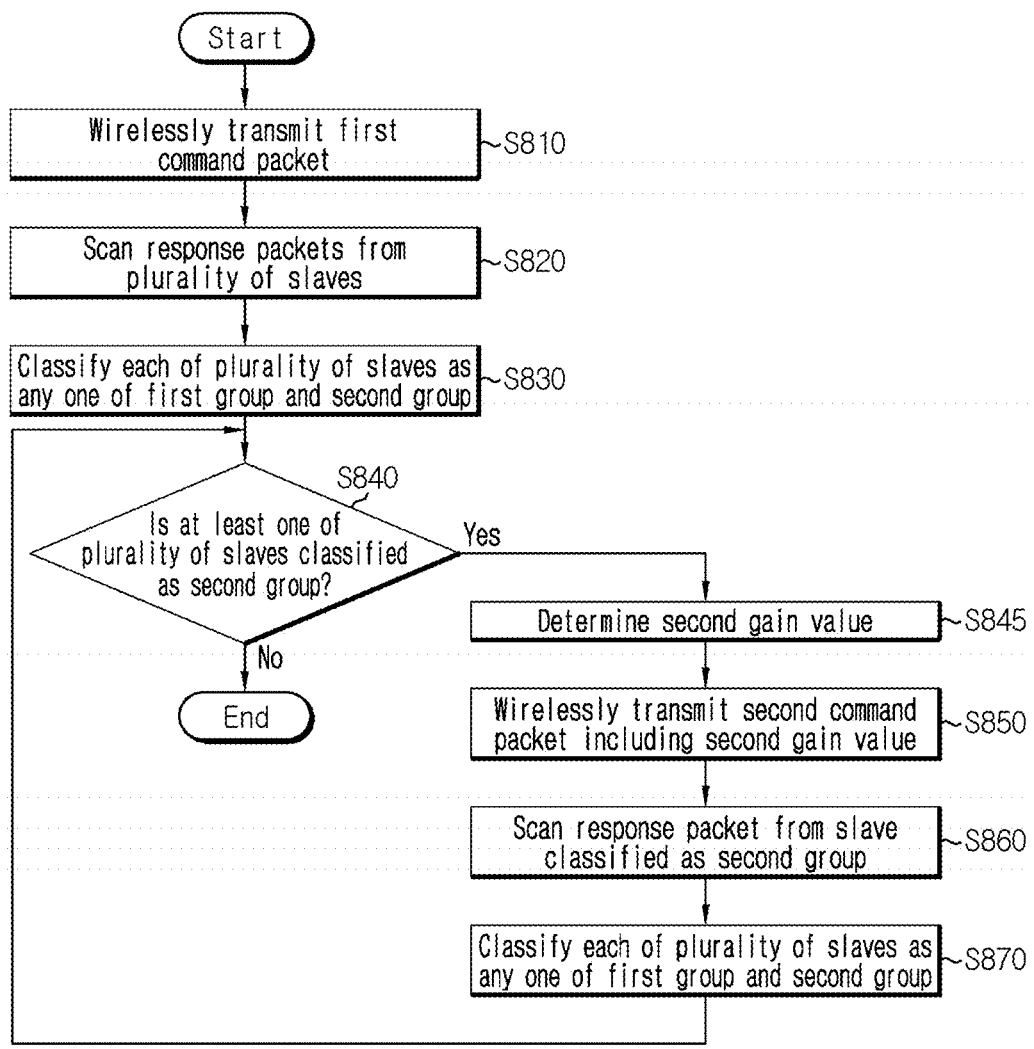
FIG. 8 is a flowchart showing a method for wirelessly collecting, by a master, response packets from a plurality of slaves according to a third embodiment of the present disclosure.

FIG. 8 is a flowchart showing a method for wirelessly collecting, by the master 100, response packets from the plurality of slaves 200_1~200_N according to a third embodiment of the present disclosure. The method of FIG. 8 may be performed in each predetermined cycle. The lookup table 700 shown in FIG. 7 may be referenced by the master 100 in not only the second embodiment but also the third embodiment.

Referring to FIGS. 1 to 4, 7 and 8, in step S810, the master 100 wirelessly transmits a first command packet. The first command packet may be wirelessly transmitted with the predetermined first signal strength. The first command packet includes first data and second data, and may further include third data. The first data of the first command packet has the first value indicating that the first command packet is for trying wireless connection with the plurality of slaves 200_1~200_N for the first time in the current cycle. The second data of the first command packet includes data for requesting the plurality of slaves 200_1~200_N to perform a specific function. The third data of the first command packet includes the IDs of the plurality of slaves 200_1~200_N.

When the first data of the first command packet has the first value, each of the plurality of slaves 200_1~200_N may perform the function requested by the second data of the first command packet, and wirelessly transmit the response packet including the ID thereof with the predetermined second signal strength or the reference signal strength allocated thereto.

In step S820, the master 100 scans the response packets from the plurality of slaves 200_1~200_N for the first standby period. That is, the master 100 collects the response packet wirelessly transmitted by the plurality of slaves 200_1~200_N from the time point at which the first command packet was transmitted to the time point at which a predetermined period of time has passed from the transmission of the first command packet.

In step S830, the master 100 classifies each of the plurality of slaves 200_1~200_N as any one of the first group and the second group. In detail, the master 100 may classify the slave 200 to which the ID of each response packet scanned for the first standby period is allocated as the first group, and classify the remaining slave 200 as the second group. That is, the slave 200 having not transmitted the response packet or having transmitted the response packet that was not received by the master 100 may be classified as the second group by the master 100.

In step S840, the master 100 determines whether at least one of the plurality of slaves 200_1~200_N is classified as the second group. That is, the master 100 checks if at least one slave 200 is still not wirelessly connected with the master 100 in the current cycle. When a value of the step S840 is "YES", step S845 is performed. The value of the step S840 being "NO" indicates that the master 100 is wirelessly connected with all the plurality of slaves 200_1~200_N, and the wireless control method may end.

In step S845, the master 100 determines a second gain value. The master 100 determines the second gain value from the lookup table 700 by using as an index, the lowest ranked ID among the IDs of at least one slave 200 belonging to the second group. When the slave 200_2 and the slave 200_N-1 belong to the second group as shown in FIG. 3, $S_{N-1}$ is the lowest ranked ID, and thus $G_{N-1}$ is determined as the second gain value.

In step S850, the master 100 wirelessly transmits a second command packet. The second command packet may be wirelessly transmitted with the predetermined first signal strength or the first amplified signal strength. The first amplified signal strength may be determined by the method described with reference to FIGS. 6 and 7. The second command packet includes first data, second data and third data, and further includes fourth data. The first data of the second command packet has the second value indicating that the second command packet is for retrying wireless connection between the master 100 and the second group. The second data of the second command packet includes data for requesting all the slaves 200 belonging to the second group to perform a specific function. The third data of the second command packet includes the IDs of all the slaves 200 belonging to the second group. The second command packet further includes fourth data. The fourth data of the second command packet indicates the second gain value determined in the step S845.

When receiving the second command packet, each of the plurality of slaves 200_1~200_N determines whether the third data of the second command packet includes the ID thereof in response to the first data of the second command packet having the second value. The slave 200 belonging to the second group may perform the function requested by the second data of the second command packet whose the third data includes the ID of the slave 200.

The slave 200 belonging to the second group determines a second amplified signal strength by multiplying the predetermined second signal strength or the reference signal strength allocated to the corresponding slave 200 by the second gain value indicated by the fourth data of the second command packet. Subsequently, each slave 200 belonging to the second group transmits a response packet including the ID of the corresponding slave 200 to the master 100 with the second amplified signal strength. In contrast, the slave 200 belonging to the first group does not transmit a response packet as the second data of the second command packet does not include the ID of the corresponding slave 200, and may delete the second command packet from the memory device of the corresponding slave 200 (i.e., ignore the request made by the third data of the second command packet).

In step S860, the master 100 scans the response packet from the slave 200 classified as the second group for the second standby period. That is, the master 100 collects the response packet wirelessly transmitted by each slave 200 belonging to the second group until a predetermined period of time has passed from the time point at which the second command packet was transmitted.

In step S870, the master 100 classifies each of the plurality of slaves 200_1~200_N as any one of the first group and the second group. In detail, the master 100 may classify the slave 200 to which the ID of each response packet scanned for the second standby period is allocated from the second group to the first group, and maintain the remaining slave 200 belonging to the second group as the second group. After the S870, the wireless control method may move to the step S840.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A wireless control system for wirelessly collecting battery information of each of first to $N^{th}$ battery modules, the wireless control system comprising:
a master configured to wirelessly transmit a first command packet; and
first to $N^{th}$ slaves to which first to $N^{th}$ identifications (IDs) are allocated, respectively,
wherein the first slave is configured to wirelessly transmit a first response packet including first battery information indicating a condition of the first battery module and the first ID, when the first slave receives the first command packet,
wherein a $k+1^{th}$ slave is configured to, when the $k+1^{th}$ slave receives the first command packet, stand by to receive a $k^{th}$ response packet from a $k^{th}$ slave for a preparation period, and wirelessly transmit a $k+1^{th}$ response packet including $k+1^{th}$ battery information indicating a condition of the $k+1^{th}$ battery module and a $k+1^{th}$ ID,
wherein when the $k^{th}$ response packet is received by the $k+1^{th}$ slave within the preparation period, the $k+1^{th}$ response packet further includes $k^{th}$ battery information indicating a condition of a $k^{th}$ battery module and a $k^{th}$ ID, and
wherein N is a natural number of 2 or greater, and k is a natural number of 1 or greater and N−1 or smaller.

2. The wireless control system according to claim 1, wherein the $N^{th}$ slave is configured to wirelessly transmit an $N^{th}$ response packet including $N^{th}$ battery information indicating a condition of the $N^{th}$ battery module and the $N^{th}$ ID at least two times, when the $N^{th}$ slave receives the first command packet.

3. The wireless control system according to claim 1, wherein the $N^{th}$ slave is configured to wirelessly transmit an $N^{th}$ response packet including $N^{th}$ battery information indicating a condition of the $N^{th}$ battery module and the $N^{th}$ ID, when the $N^{th}$ slave receives the first command packet, and
wherein an $N-1^{th}$ slave is configured to wirelessly transmit an additional response packet including the $N^{th}$ battery information and the $N^{th}$ ID, when the $N-1^{th}$ slave receives the $N^{th}$ response packet.

4. The wireless control system according to claim 1, wherein the $k+1^{th}$ response packet does not include the $k^{th}$ ID and the $k^{th}$ battery information, when the $k^{th}$ response packet is not received by the $k+1^{th}$ slave within the preparation period.

5. The wireless control system according to claim 1, wherein the master is configured to:
set the $k+1^{th}$ slave as a first group, when the $k+1^{th}$ response packet is received by the master within a predetermined period of time from a time point at which the first command packet was wirelessly transmitted, and
set the $k+1^{th}$ slave as a second group, when the $k+1^{th}$ response packet is not received by the master within the predetermined period of time from the time point at which the first command packet was wirelessly transmitted.

6. The wireless control system according to claim 5, wherein the master is configured to wirelessly transmit a second command packet, when at least one of the first to $N^{th}$ slaves is set as the second group, and
wherein the second command packet includes the IDs of each slave set as the second group.

7. The wireless control system according to claim 6, wherein the master is configured to:
wirelessly transmit the first command packet with a first signal strength, and
wirelessly transmit the second command packet with a first amplified signal strength,
wherein the first amplified signal strength is higher than the first signal strength.

8. The wireless control system according to claim 6, wherein the $k+1^{th}$ slave is configured to wirelessly transmit the $k+1^{th}$ response packet when the second command packet includes the $k+1^{th}$ ID.

9. The wireless control system according to claim 8, wherein the $k+1^{th}$ slave is configured to:
when the second command packet includes the $k+1^{th}$ ID, determine a relative rank of the $k+1^{th}$ ID among all the IDs included in the second command packet, and
wirelessly transmit the $k+1^{th}$ response packet at a time slot associated with the relative rank.

10. A battery pack comprising the wireless control system according to claim 1.

11. A wireless control method for wirelessly collecting, by a master, first to $N^{th}$ battery information indicating conditions of first to $N^{th}$ battery modules from first to $N^{th}$ slaves to which first to $N^{th}$ identifications (IDs) are allocated, respectively, the wireless control method comprising:
wirelessly transmitting, by the master, a first command packet to the first to $N^{th}$ slaves;
wirelessly transmitting, by the first slave, a first response packet including the first battery information and the first ID when the first slave receives the first command packet; and
standing by, by a $k+1^{th}$ slave, to receive a $k^{th}$ response packet from a $k^{th}$ slave for a preparation period, and wirelessly transmitting a $k+1^{th}$ response packet including $k+1^{th}$ battery information and a $k+1^{th}$ ID, when the $k+1^{th}$ slave receives the first command packet,
wherein the $k+1^{th}$ response packet further includes $k^{th}$ battery information indicating a condition of the $k^{th}$ battery module and a $k^{th}$ ID when the $k^{th}$ response packet is received by the $k+1^{th}$ slave within the preparation period, and
wherein N is a natural number of 2 or greater, and k is a natural number of 1 or greater and N−1 or smaller.

12. The wireless control method according to claim 11, further comprising:
wirelessly transmitting, by the $N^{th}$ slave, an $N^{th}$ response packet including the $N^{th}$ battery information and the $N^{th}$ ID at least two times, when the $N^{th}$ slave receives the first command packet.

13. The wireless control method according to claim 11, further comprising:
wirelessly transmitting, by the $N^{th}$ slave, an $N^{th}$ response packet including the $N^{th}$ battery information and the $N^{th}$ ID, when the $N^{th}$ slave receives the first command packet; and
wirelessly transmitting, by an $N-1^{th}$ slave, an additional response packet including the $N^{th}$ battery information and the $N^{th}$ ID, when the $N-1^{th}$ slave receives the $N^{th}$ response packet.

* * * * *